(12) United States Patent
Paravia et al.

(10) Patent No.: US 8,497,626 B2
(45) Date of Patent: Jul. 30, 2013

(54) LARGE AREA LIGHT EMITTING DIODE LIGHT SOURCE

(75) Inventors: Mark Paravia, Stutensee-büching (DE); Dirk Hente, Wuerselen (DE)

(73) Assignee: Koninklijke Philips N. V., Eindhoven (NL)

( * ) Notice: Subject to any disclaimer, the term of this patent is extended or adjusted under 35 U.S.C. 154(b) by 541 days.

(21) Appl. No.: 12/525,842

(22) PCT Filed: Feb. 8, 2008

(86) PCT No.: PCT/IB2008/050461
§ 371 (c)(1),
(2), (4) Date: Dec. 23, 2009

(87) PCT Pub. No.: WO2008/099315
PCT Pub. Date: Aug. 21, 2008

(65) Prior Publication Data
US 2010/0140598 A1 Jun. 10, 2010

(30) Foreign Application Priority Data
Feb. 12, 2007 (EP) .................................... 07102168

(51) Int. Cl.
*H01J 1/62* (2006.01)
(52) U.S. Cl.
USPC ......................................................... 313/504
(58) Field of Classification Search
USPC ......................................................... 313/504
See application file for complete search history.

(56) References Cited

U.S. PATENT DOCUMENTS

| 5,530,318 | A | * | 6/1996 | Ensign et al. | 315/74 |
| 6,157,066 | A | * | 12/2000 | Kobayashi | 257/363 |
| 6,713,955 | B1 | | 3/2004 | Roitman et al. | |
| 6,870,196 | B2 | | 3/2005 | Strip | |
| 7,012,585 | B2 | | 3/2006 | Agostinelli et al. | |
| 2003/0010985 | A1 | | 1/2003 | Shen | |
| 2003/0052616 | A1 | | 3/2003 | Antoniadis et al. | |
| 2003/0184219 | A1 | | 10/2003 | Duggal et al. | |
| 2005/0214963 | A1 | * | 9/2005 | Daniels et al. | 438/29 |
| 2006/0066223 | A1 | | 3/2006 | Pschenitzka | |
| 2006/0119253 | A1 | * | 6/2006 | Carter et al. | 313/503 |
| 2009/0160320 | A1 | * | 6/2009 | Borner et al. | 313/504 |

FOREIGN PATENT DOCUMENTS

| JP | 11040354 A | 2/1999 |
| JP | 2001319778 A | 11/2001 |
| WO | 0036662 A1 | 6/2000 |

* cited by examiner

*Primary Examiner* — Anh Mai
*Assistant Examiner* — Michael Santonocito
(74) *Attorney, Agent, or Firm* — David Zivan; Mark L. Beloborodov

(57) ABSTRACT

The present invention relates to a LED light source comprising at least one layer of light emitting material (3), in particular organic light emitting material, sandwiched between two electrode layers (2, 4). At least one of the electrode layers (2, 4) is structured to form a pattern of electrode segments (5), each electrode segment (5) being in electrical contact with at least three of its nearest neighbor electrode segments (5) via direct electrical connections (6), which are designed to act as electrical fuses between the electrode segments (5). The invention allows the design of a large area LED light source having a homogeneous light density without the risk of failure of larger light emitting areas.

11 Claims, 7 Drawing Sheets

LARGE AREA LIGHT EMITTING DIODE LIGHT SOURCE

FIELD OF THE INVENTION

The present invention relates to a light emitting diode (LED) light source comprising at least one layer of light emitting material, in particular organic light emitting material, sandwiched between two electrode layers, wherein at least one of the electrode layers is structured to form a pattern of electrode segments.

BACKGROUND OF THE INVENTION

Organic light emitting diodes (OLED) comprise at least one layer of an organic material which emits light in the visible spectral range upon application of an external voltage. The organic layer, also known as active layer, is sandwiched between two electrode layers in order to apply the necessary voltage for light emission. At least one of these electrode layers is of an electrically conducting material which is at least partly transparent for wavelengths of the light emitted by the active layer. It is also known to arrange one or several further layers between the electrode layers and the active layer. These additional layers may for example serve as electron or hole transport or injection layers. The construction of such a OLED light source is similar to a parallel-plate capacitor with the active material between the two electrode plates.

There is a need to provide large area LED light sources with lateral extensions of the active layer and electrode layers ranging from several centimeters to more than one meter. The active layer in an OLED light source is typically 100 nm or even less in thickness. Due to this small thickness and to the roughness and irregularities of the underlying base substrate, on which the layers are arranged, local or small area electrical shorts may occur between the two electrode layers. Further reasons of such electrical shorts are the application of a too high voltage between the electrodes or the aging of the layer structure. The leakage current caused by an electrical short inhibits the injection of electrons into the active layer so that this layer in a large area up to the whole area of the light source stops emitting light. The probability and number of shorts is proportional to the geometrical area of the light source, i.e. the active layer, which is in particular problematic for large area OLED or LED light sources.

U.S. Pat. No. 6,870,196 B2 discloses a OLED light source comprising a plurality of groups of OLED segments, the OLED segments in each group being electrically connected in parallel and the groups being electrical connected in series. A fuse is connected in series with each OLED segment for opening the electrical connection to an OLED segment in response to an electrical short. Due to the series/parallel connection of the OLED segments of this light source, the occurrence of an electrical short only influences one segment of the light source, the corresponding OLED segment, whereas the remaining segments remain unaffected and continue to emit light.

SUMMARY OF THE INVENTION

It is an object of the present invention to provide a light emitting diode (LED) light source which can be designed to provide a large light emitting area with a homogeneous light density and without the risk of failure of larger areas due to electrical shorts.

The object is achieved with the LED light source according to claim 1. Advantageous embodiments of the LED light source are subject matter of the sub claims or are described in the following description and embodiments for carrying out the invention.

The proposed LED light source comprises at least one layer of light emitting material sandwiched between two electrode layers and emitting light upon application of an electrical voltage exceeding a threshold voltage between the electrode layers. The light emitting material preferably is an organic material to provide an organic light emitting diode (OLED) light source. Nevertheless, it is also possible to use an inorganic light emitting material, in particular an appropriate semiconductor material. At least one of the electrode layers is structured to form a pattern of closely spaced electrode segments. The term closely space means that the spacing between the electrode segments is smaller than the lateral extension of the electrode segments in the corresponding direction. Each inner electrode segment of the pattern is in electrical contact with at least three of its nearest neighbor electrode segments via direct electrical connections which are designed to operate as electrical fuses between the electrode segments, in particular having a higher current density than the electrode segments. The term inner electrode segments in this context means electrode segments which are not at the border of the area defined by the lateral extension of the electrode layer. Such border electrode segments may have less than three nearest neighbors. Therefore, at least one of the electrode layers is structured to form several electrode segments which are surrounded by a grid of fuses which have a higher current density than the electrode segments.

The proposed LED light source therefore comprises a continuous layer of the light emitting material, i.e. an active layer, sandwiched between the two electrode layers. As known in the art, it is nevertheless possible to arrange further layers, like electron or hole transport or injection layers, between the electrode layers and the active layer.

At least one of the electrode layers is at least partially transparent for at least a wavelength range of the light emitted by the active layer. An example for such an electrically conducting material is ITO (Indium Tin Oxide). Also both electrode layers may be made of such a material enabling the emission of the generated light through both main surfaces of the LED light source.

The layer sequence of the proposed LED light source is preferably arranged on a substrate. This base substrate may also be made of a material which is at least partially transparent for a wavelength region of the light emitted by the active layer. This wavelength region must overlap at least partly with the wavelength region for which the electrode layer between the substrate and the active layer is transparent. Such a substrate can be rigid, semi rigid of flexible and can be made, for example, of a glass or a polymer having a suitable transparency. During the manufacturing process a bottom electrode layer is deposited on the surface of the substrate. Then the light emitting material layer is deposited or grown on the electrode layer and subsequently the second electrode layer is deposited on the light emitting material layer and structured according to the present invention. The deposition of the layers can be performed with known deposition techniques like chemical vapor deposition or sputtering. The patterning of the electrode layer can be performed with known techniques like photolithographic structuring techniques. Nevertheless, also techniques like ink jet printing, screen printing and others are possible.

With the proposed LED light source a large area light emission can be achieved with corresponding large lateral extension of the light emitting layer and electrode layers. Due to the patterning of at least one of the electrode layers and the provision of the corresponding electrical connections designed to act as electrical fuses between the electrode segments the occurrence of a local electrical short only influences the individual electrode segment and corresponding light source area in which the short occurs. The electrical connections—in the following also referred to as fuses—connecting this electrode segment with its neighbors then open so that the short is electrically separated from the remaining area of the light source. In other words, in the proposed LED light source these fuses form a grid around the electrode segments which then is locally destroyed around the segments in which shorts occur. The local short is therefore separated from the rest of the light source so that the remaining grid remains electrically conducting for undisturbed light emission. Since each fuse can be designed in such a way that the fuse resistance is not higher than the segment resistance e.g. by choosing square shaped fuse segments, the change in current flow through the whole LED or OLED is almost unchanged. This implies that even with fuse segments which are preferable square shaped the light output of the LED or OLED is visually unchanged. Due to the provision of these fuses the light source is self healing when local shorts occur.

In a preferred embodiment of the light source the electrical connections or fuses are formed of the electrode layer itself, preferably the cathode layer, with a square shaped form. A further possibility is to structure the electrode layer to form regions of a lower thickness between the electrode segments.

The main property of the fuses is the higher electrical current density in these electrical connections compared to the current densities in the electrode segments. Due to this higher current density in case of an electrical short these electrical connections or fuses automatically are a destroyed or open due to temperature rise and or electromigration. Electromigration describes mass transport in metals which are stressed by high current densities. It is known from experimental work that mass transport in a metal strip is proportional to $A*J^2*\exp(-E_a/k*T)$, wherein A is a constant related to the cross section of the metal strip, J the current density, $E_a$ the activation energy in eV, k the Boltzmann constant and T the temperature. It is also known that significant electromigration e.g. in aluminum takes place at current densities of several hundreds of $kA/cm^2$. It can be seen from the above formula that electromigration is accelerated by higher temperatures.

It is one of the central ideas of this invention to use the effect of an excess current density in the fuse cross sectional area during a short to destroy the fuse link itself by heating and or electromigration. During normal operation the current density should be orders of magnitude lower.

The fuses can also be formed of other materials than the electrode layer. Nevertheless the forming of these fuses by structuring of the electrode layer has the significant advantage that the whole LED light source can be manufactured in a standard process for manufacturing such light sources, wherein only one or both of the electrode layers are additionally structured.

The geometrical form of the electrode segments and the spacing between these electrode segments is not limited to a special form or extension. The pattern can be symmetrical or asymmetrical, periodic or non periodic. Preferably, the electrode segments have a geometrical form composed of at least n straight sides, with $n \geq 3$, wherein these segments then are arranged to have n nearest neighbors with which they are electrically connected through the fuses. The geometrical form can then be, for example, a triangle, a rectangle or a hexagon. Preferably the electrode segments are equally spaced in the pattern.

In a further embodiment, a diffuser element is attached to one or both sides, the light emitting sides, of the light source. With such a diffuser element, the light emitted from several positions of the light emitting area is mixed, so that small areas not emitting due to shorts are not or nearly not visible to the naked eye.

The thickness of the light emitting layer, i.e. the active layer, is preferably about 100 nm or less. This layer can be made of known organic materials. Such materials are electrically luminescent small organic or organo-metallic molecules or conjugated polymers, copolymers or blends thereof or even small molecule dispersions in polymer binders that emit light from either exited singlet or triplet states or both whereby the exitation is created by the recombination of positive and negative charge carriers injected into the layer from the electrodes.

The proposed LED light source may be used for all lighting applications, for which the luminance achievable with LED's is adequate, in particular lighting applications requiring large area light sources. Examples of lighting applications for LED light sources according to the present invention are for example described in U.S. Pat. No. 6,870,196 B2 which has already being described in the introductory portion of this description.

These and other aspects of the invention will be apparent from and illustrated with reference to the embodiments described herein after.

BRIEF DESCRIPTION OF THE DRAWINGS

The proposed LED light source is described in the following by way of examples in connection with the accompanying figures without limiting the scope of protection as defined by the claims. The figures show:

DETAILED DESCRIPTION OF EMBODIMENTS

Figure 1:
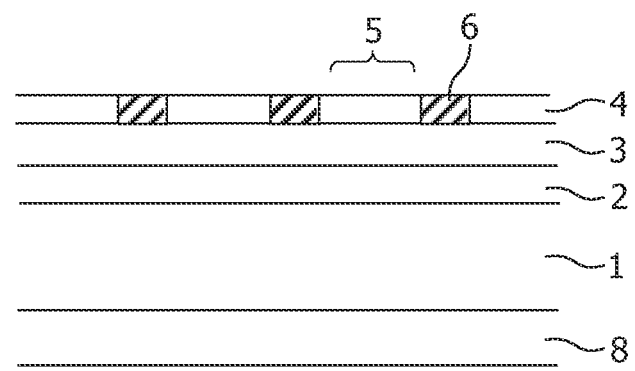
FIG. 1 a partial cut view of a exemplary layer sequence of the proposed LED light source.

An example of the layer sequence of the proposed LED light source is depicted in FIG. 1. The layer sequence is arranged on a base substrate 1 which is made of a glass or polymer material transparent for visible light. A first electrode layer 2 is arranged on this base substrate 1. This first electrode layer 2 has a constant thickness over the whole extension of the light source. A layer of an organic light emitting material 3 is sandwiched between this first electrode layer 2 and a second electrode layer 4. The first electrode layer 2 forms the anode electrode, the second electrode layer 4 the cathode electrode of this OLED. Upon application of an appropriate voltage between the two electrode layers 2, 4, the light emitting material layer 3 emits light in the visible wavelength range. At least the first electrode layer 2 is made of an electrically conducting material which is transparent for visible light, for example of ITO or of a electrically conducting polymer material. Therefore, the light emitted by the light emitting layer 3 can pass out through the lower surface of the light source of FIG. 1. In the same manner, the second electrode layer 4 can also or alternatively to the first electrode layer 2 be made of an optically transparent material in order to enable the emission of light through the upper main surface of the light source. A diffuser element 8 may be attached to one or both sides of the light source.

In the present example, the second electrode layer 4 is structured to form a pattern of electrode segments 5 which are electrically in contact with neighboring electrode segments through electrical connections 6. The electrical connections 6 are designed to serve as fuses which blow up when local shorts between the two electrode layers occur in the corresponding region.

As already mentioned in the previous portion of the description, also further layers can be arranged between the electrode layers 2, 4 and the light emitting layer 3. With further layers, like electron or hole transport layers, also further light emitting layers can be arranged between the two electrode layers. Furthermore, one or more protection or adhesion layers can be arranged between the substrate 1 and the first electrode layer 2 or on the second electrode layer 4.

Figure 2:
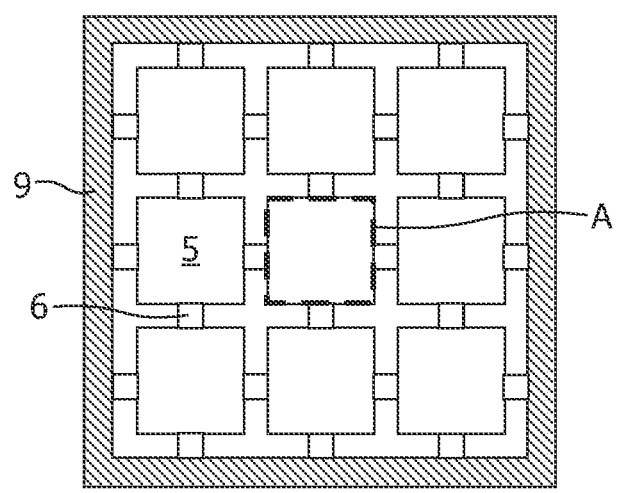
FIG. 2 a top view of a first example of an OLED according to the present invention.
Figure 3:
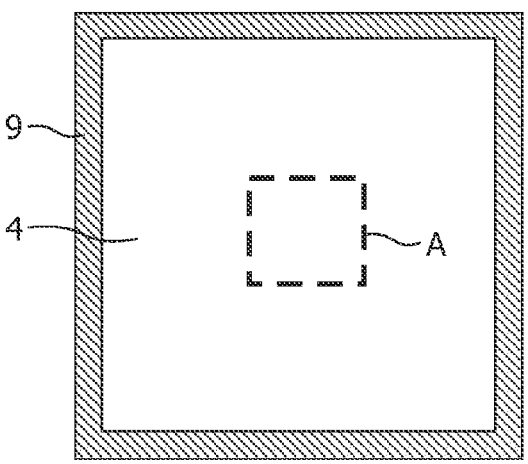
FIG. 3 a top view of an OLED of the prior art.

FIG. 2 shows a first example of an OLED according to the present invention. In this example the second electrode layer 4, i.e. the cathode layer, is structured to form square shaped electrode segments 5 connected via square shaped fuses 6 made of the same layer. The electrode segments 5 in this example have a width of 41 mm and a length of 41 mm. The (lateral) dimensions of the square shaped fuses 6 are 3×3 mm. The OLED is electrically contacted through contact electrode 9 surrounding the OLED. FIG. 3 for comparison shows an OLED of the prior art, in which the second electrode layer 4, the cathode layer, is not structured.

Figure 4:
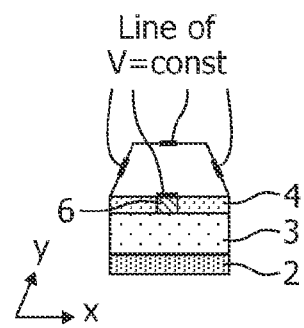
FIG. 4 a model of center segment A of the OLED of FIG. 2.
Figure 5:
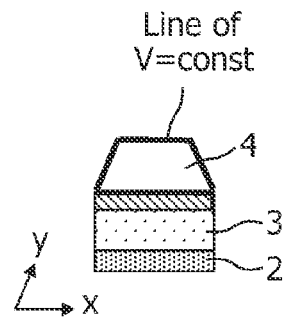
FIG. 5 a model of center segment A of the OLED of FIG. 3.

FIG. 4 shows a model of center segment A of the OLED of FIG. 2, in which the lines of constant voltage are indicated. In comparison, FIG. 5 shows the model of center region A of the OLED of FIG. 3 with the line of constant voltage also indicated.

A given efficacy of the active layer of the OLED of FIG. 2 is $LO_{eff}$=42 cd/m². The cathode layer material is aluminum with a conductivity of s=2.6 µΩ*cm and a thickness d of 260 nm. This corresponds to a square resistance of $R_{sqc}$=s/d=0.1Ω. The first electrode layer 2, i.e. the anode layer, is of ITO with a square resistance of 1Ω. The active layer is described analytically by the following current voltage relationship: $i=8*10^{-4} A/V^2*(v-3.5V)^2$ where v denotes the local voltage across the active layer and i the current through the active layer. This relation corresponds to an active area of 20 mm².

Figure 6:
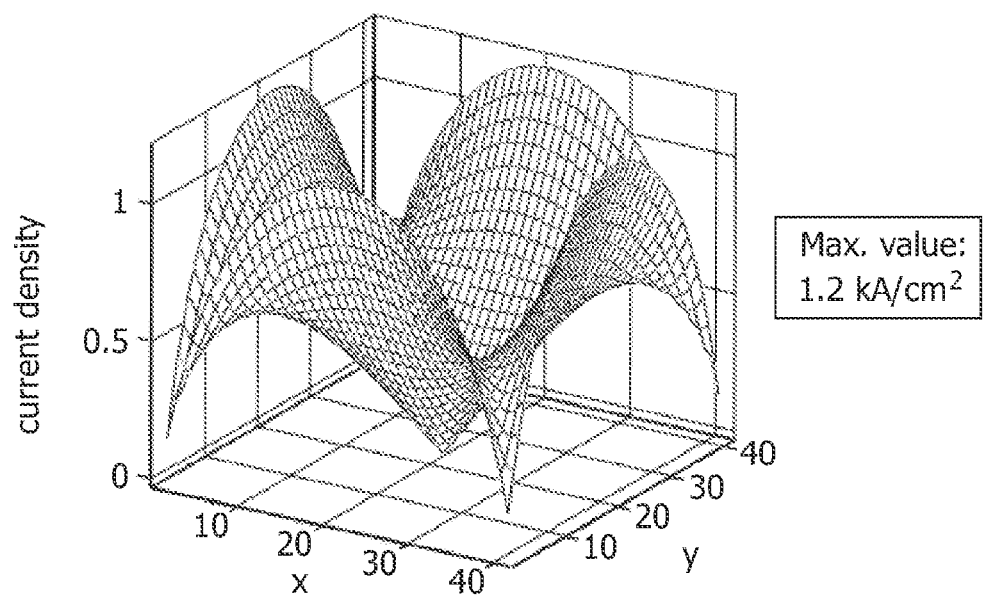
FIG. 6 calculated horizontal current density in cathode segment without fuses (prior art)
Figure 7:
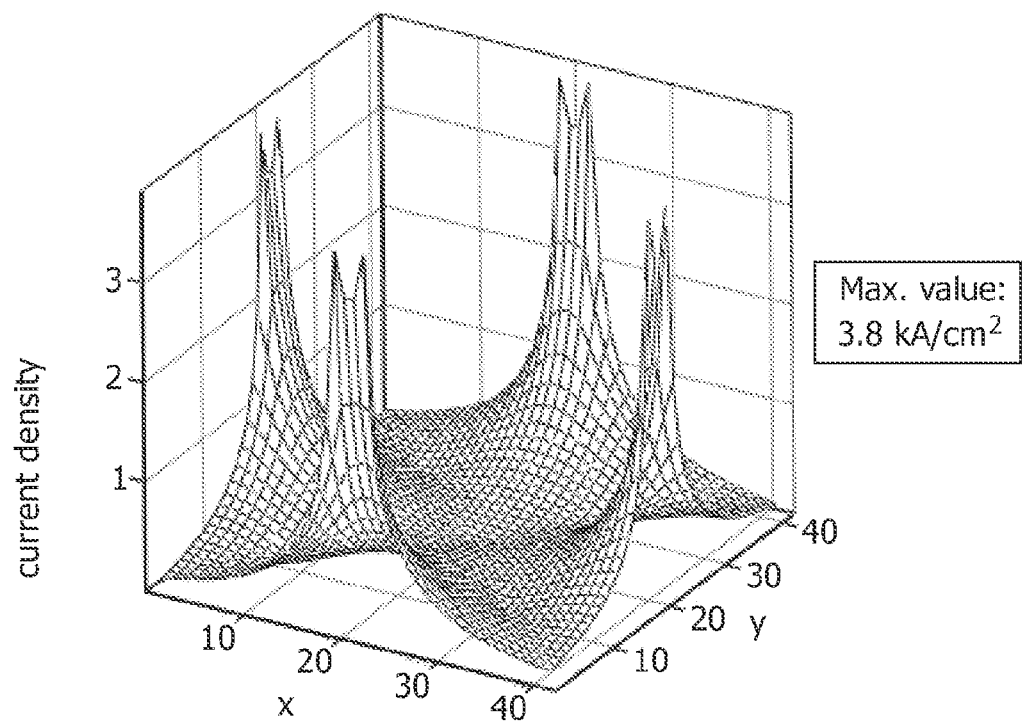
FIG. 7 calculated horizontal current density in cathode segment with fuses.
Figure 8:
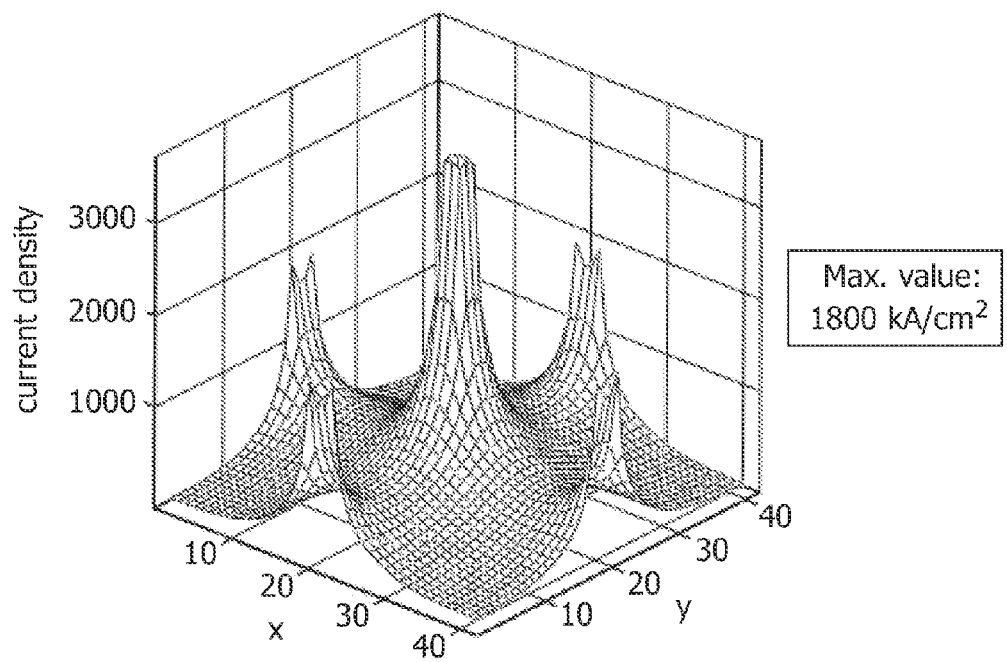
FIG. 8 calculated horizontal current density in cathode segment with fuses and short cut at center point.
Figure 9:
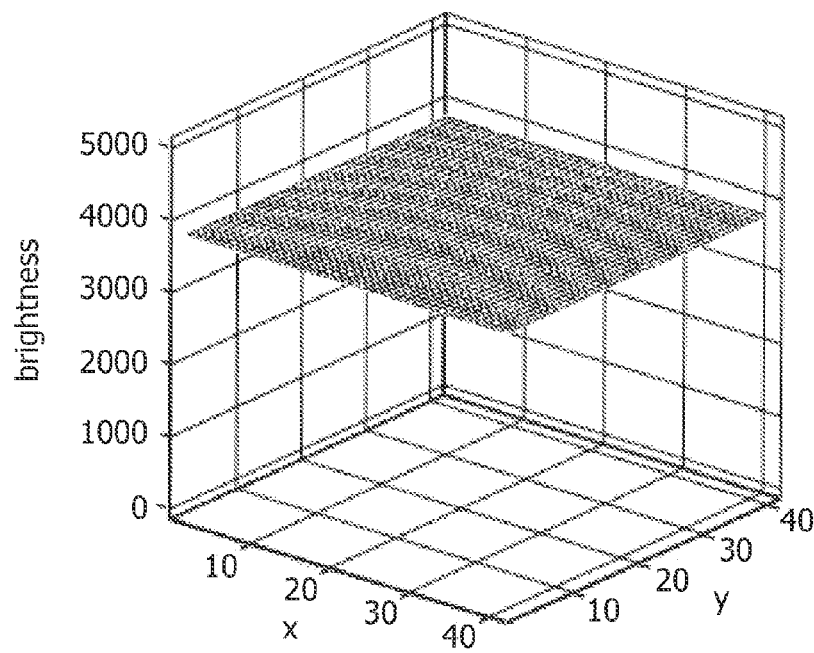
FIG. 9 calculated brightness across OLED segment without fuses (prior art)
Figure 10:
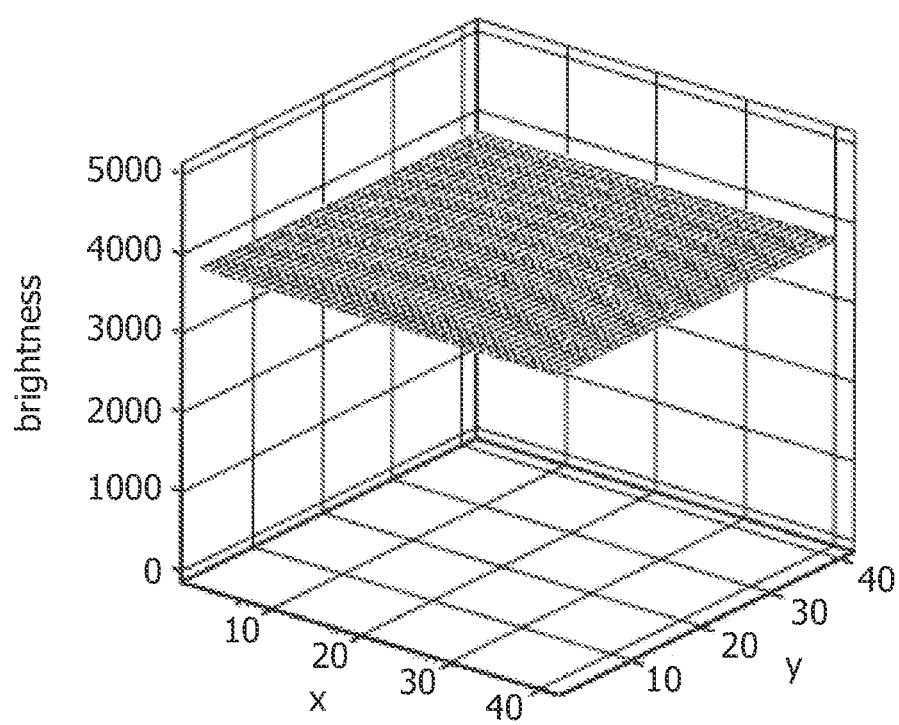
FIG. 10 calculated brightness across OLED segment with fuses.

The following figures show the resulting current densities and brightness for 3 cases:
   Case 1: no segmented cathode (prior art)
   Case 2: segmented cathode with fuse elements, no short
   Case 3: segmented cathode with fuse elements, with short in the center of the large segment FIGS. 6 and 7 show the horizontal current density in the cathode layer, i.e. the geometric sum of the x and y components of the current density vector with and without fuses. The case of a short in the center of a segment is shown in FIG. 8 for an OLED with fuses according to the present invention. FIGS. 9 and 10 show a comparison of the brightness in cd/m² across the OLED between an OLED of the prior art (FIG. 9) and an OLED according to the present invention (FIG. 10). For all cases the voltage along the edges is assumed to be constant and 5V. The fuse segments are square shaped of size 3 mm×3 mm and of the same thickness than the large segments.

Two observations can be made,
  1. introducing the fuse segments has almost no effect on the total current and light output. Even though only 7.3% of the edges are used for the current injection there is almost no increased light output at the injection points (FIGS. 9 and 10).
  2. the critical current density in the fuses is 3.8 kA/cm² which is only about 3 times higher than the unsegmented (prior art) case (see FIGS. 6 and 7). On the other hand during a short the current density is almost 3 orders of magnitude higher (1800 kA/cm²) which guarantees a destruction of the fuse elements by heat and electromigration.

Figure 11:
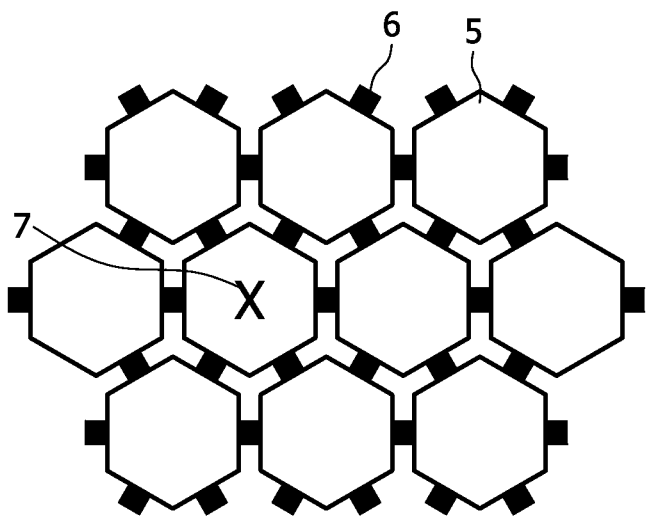
FIG. 11 a partial top view of a further example of a structured electrode layer of the proposed LED light source.

FIG. 11 shows a further example of the pattern of the upper electrode layer 4 as a partial top view. The electrode segments 5 in this example have the geometrical form of a hexagon and are equally spaced. In this example the electrical connections 6 are made of the electrode layer 4 which is structured in the regions between the electrode segments 5 to form rectangular shaped areas between the electrode segments 5. Each electrode segment 5 has six nearest neighbors to which this electrode segment is directly connected via six electrical connections 6. If an electrical short occurs at the position 7 of one of these electrode segments 5, the electrical connections 6, which surround the corresponding electrode segment 5 and represent fuses, open due to the high current through these electrical connections 6 thereby electrically isolating this electrode segment 5 from the other electrode segments 5 of the light source.

The electrical connections 6 are dimensioned to avoid the failure of light emission in a larger area due to such a short. Therefore, these connections 6 are dimensioned through their current density, in particular through their cross section or thickness, that they are destroyed when a corresponding high current flows.

The geometrical size of the electrode segments 5, i.e. their lateral extension, and the spacing between these segments is also chosen according to the desired application and tolerability of the size of areas of the light source which do not emit light. The light emitting layer 3, in this embodiment beyond the structured electrode layer, is a continuous unpatterned layer.

Figure 13:
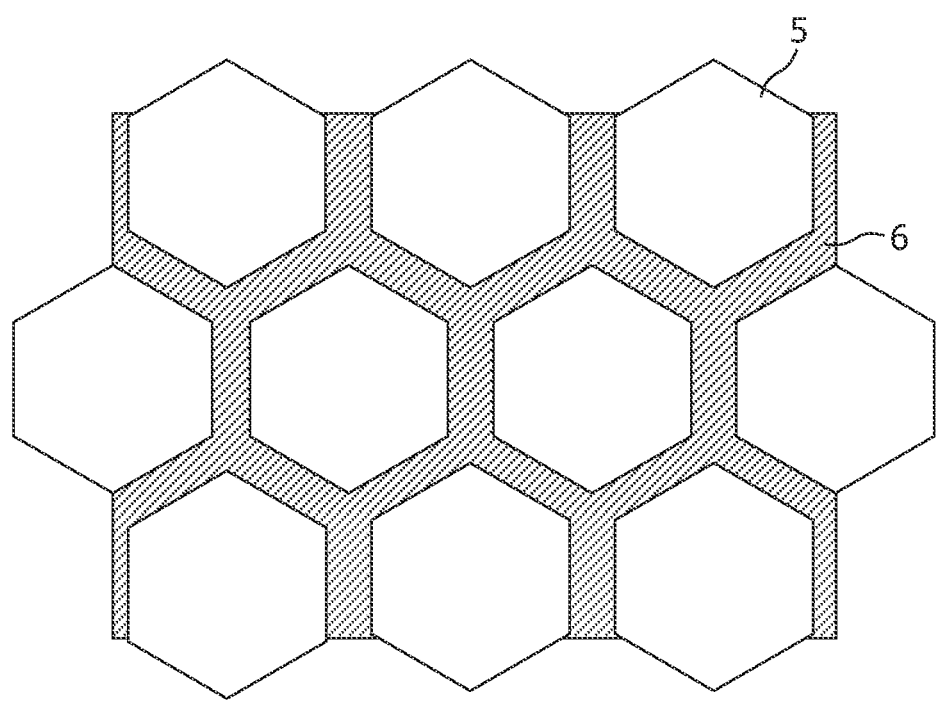
FIG. 13 a partial top view of a further example of a patterned electrode layer of the proposed LED light source.

FIG. 13 shows a further example of the pattern of the second electrode layer 4. In this example the electrical connections 6 are formed of areas of the electrode layer 4 completely surrounding the electrode segments 5 and having a lower thickness than the electrode segments 5.

Figure 12:
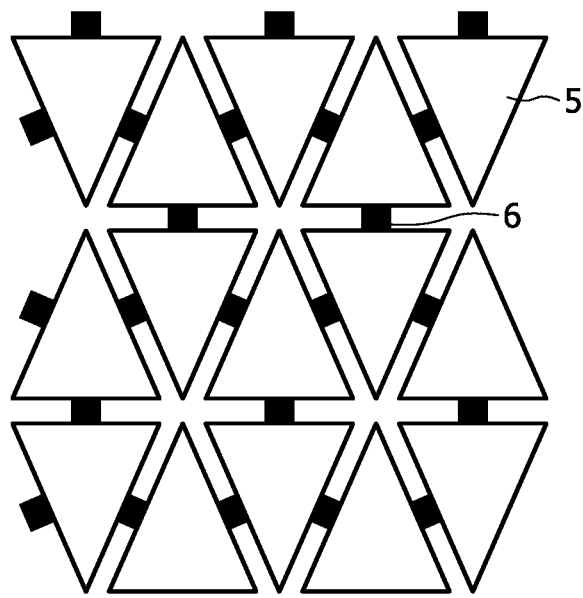
FIG. 12 a partial top view of a further example of a structured electrode layer of the proposed LED light source.

The example of FIG. 12 shows an example of a further form of the electrode segments 5, in which these segments are equally spaced triangles. Each segment 5 is surrounded by three other segments 5 to which it is electrical connected via direct electrical connections 6.

While the invention has been illustrated and described in detail in the drawings and forgoing description, such illustration and description are to be considered illustrative or exemplary and not restrictive, the invention is not limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims. For example, it is also possible to correspondingly structure the lower electrode layer 2 in the above embodiments and not the upper electrode layer 4. Furthermore, also both electrode layers can be structured. The geometrical form of the electrode segments and also the spacing of these segments can vary in the light source.

In the claims, the word "comprising" does not exclude other elements or steps, and the indefinite article "a" or "an" does not exclude a plurality. The near fact that measures are recited in mutually different dependent claims does not indicate that a combination of these measures can not be used to advantage. Any reference signs in the claims should not be construed as limiting the scope of these claims.

LIST OF REFERENCE SIGNS 1 base substrate
2 first electrode layer
3 layer of light emitting material
4 second electrode layer
5 electrode segments
6 electrical connections acting as fuses
7 position of short
8 diffuser element
9 contact electrode

The invention claimed is:

1. Light-emitting diode (LED) light source comprising:
at least one layer of light emitting material between two electrode layers, wherein
at least one of said electrode layers is of a material which is at least partially transparent for a wavelength region of the light emitted by the layer of light emitting material,
at least one of the electrode layers is structured to form a pattern of electrode segments, and
each inner electrode segment of the pattern is in electrical contact with at least three of its nearest neighbor electrode segments via direct electrical connections, which are designed to act as electrical fuses between the electrode segments, wherein said direct electrical connections are formed of regions that completely surround the inner electrode segments and are thinner than a thinnest dimension of the inner electrode segments.

2. LED light source according to claim 1, wherein said direct electrical connections are designed to have a higher current density during normal operation of the light source than the electrode segments.

3. LED light source according to claim 1, wherein said direct electrical connections are formed of regions of the structured electrode layer.

4. LED light source according to claim 1, wherein said direct electrical connections are strip lines formed of the structured electrode layer.

5. LED light source according to claim 1, wherein said direct electrical connections are square shaped elements formed of the structured electrode layer.

6. LED light source according to claim 1, wherein the electrode layers with the layer of light emitting material are arranged on a base substrate.

7. LED light source according to claim 6, wherein said base substrate is at least partially transparent for a wavelength region of the light emitted by the layer of light emitting material.

8. LED light source according to claim 1, wherein a diffuser element is attached to a light emitting side of the light source.

9. LED light source according to claim 1, wherein the electrode segments have a geometrical form which is composed of n straight sides and each inner electrode segment is in electrical contact via the direct electrical connections with n nearest neighbor electrode segments, and wherein $n \geq 3$.

10. LED light source according to claim 1, wherein the electrode segments are equally spaced.

11. LED light source according to claim 1, wherein the light emitting material is an organic material.

* * * * *